United States Patent [19]

Kamon

[11] Patent Number: 5,219,686
[45] Date of Patent: Jun. 15, 1993

[54] PHOTOMASK
[75] Inventor: Kazuya Kamon, Itami, Japan
[73] Assignee: Mitsubishi Denki Kabushiki Kaisha, Tokyo, Japan
[21] Appl. No.: 627,590
[22] Filed: Dec. 14, 1990
[30] Foreign Application Priority Data
  Mar. 1, 1990 [JP] Japan .................................. 2-52079
[51] Int. Cl.$^5$ .............................................. G03F 9/00
[52] U.S. Cl. ..................................... 430/5; 430/311
[58] Field of Search .................................. 430/5, 311
[56] References Cited
  U.S. PATENT DOCUMENTS
  4,764,441  8/1988  Ohta et al. .............................. 430/5
  4,777,116  10/1988  Kawatsuki et al. ................. 430/325
  5,045,417  9/1991  Okamoto ................................. 430/5

FOREIGN PATENT DOCUMENTS
  1190082  7/1985  Canada .
  6250811  3/1989  Japan .
  58173744 4/1990  Japan .

OTHER PUBLICATIONS
WPAT Abstract 83-790097/42, Levenson, Image Resolution of Photolithographic Transmission Mask in, 1983.

Primary Examiner—Marion E. McCamish
Assistant Examiner—Mark A. Chapman
Attorney, Agent, or Firm—Oblon, Spivak, McClelland, Maier & Neustadt

[57] ABSTRACT

A photomask comprises a light blocking portion and at least one of first and second light transmitting portions adjacent to the light blocking portion. The first light transmitting portion is provided on opposite ends thereof with phase shifters for shifting the phase of a transmitted light by ½ wavelength, while the second light transmitting portion is provided in the center thereof with the phase shifter. Thus, light transmitted by ends of the first and second light transmitting portions cancel light refracted from centers thereof, so that an edge of an optical image of the photomask can be kept steep.

11 Claims, 7 Drawing Sheets

PHOTOMASK

BACKGROUND OF THE INVENTION

1. Field of the Invention

The present invention relates to a photomask used in a photolithography process or the like in an LSI manufacturing process.

2. Description of the Background Art

Figure 1:
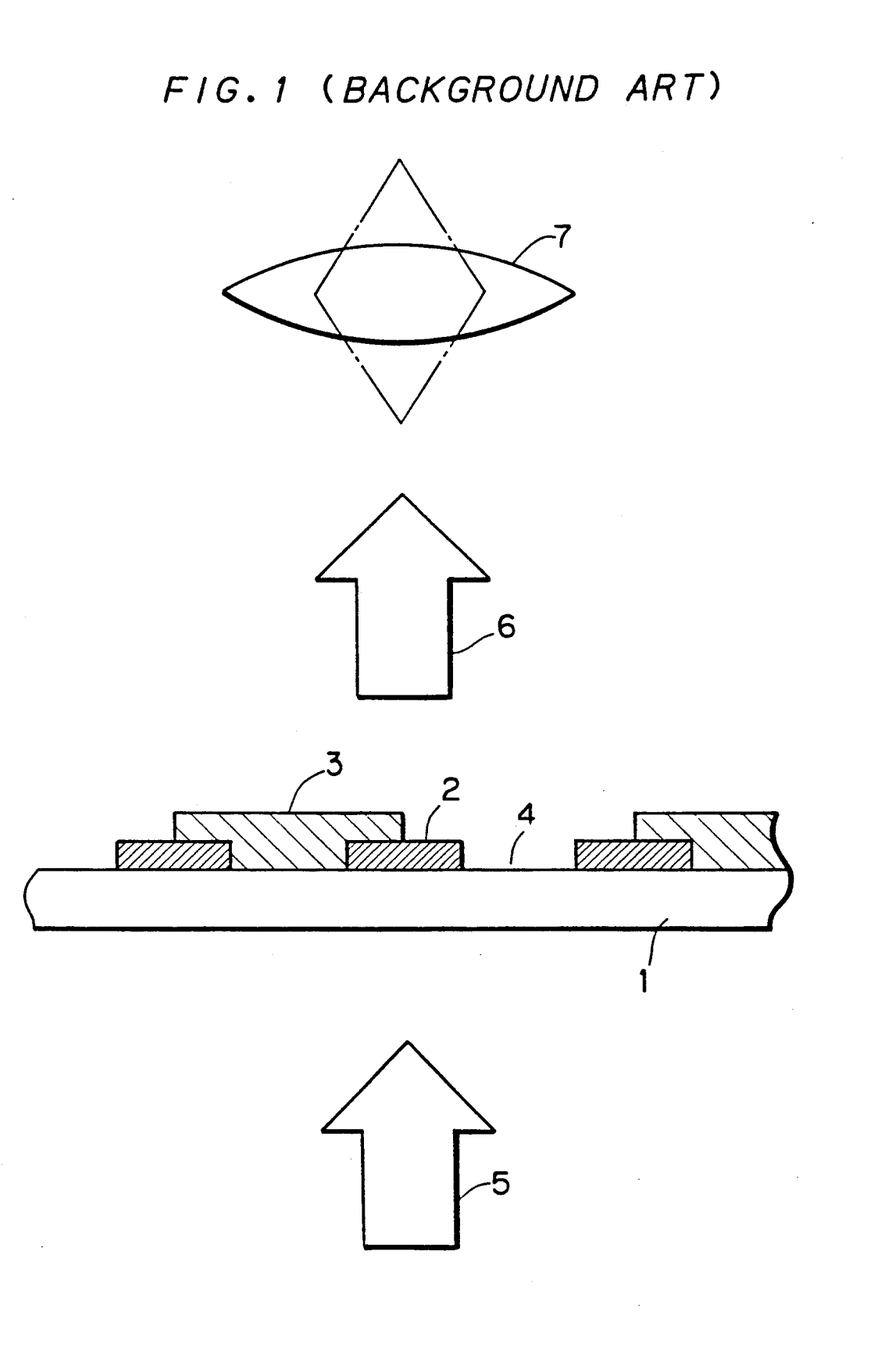
FIG. 1 is a sectional view showing a conventional photomask.

FIG. 1 is a sectional view showing a structure of this type of conventional photomask. In FIG. 1, reference numeral 1 denotes a transparent substrate like a quartz substrate. Light blocking patterns 2 like a chrome pattern defining, for example, a wire pattern and phase shifters 3 for shifting the phase of a transmitted light by ½ wavelength are formed on the transparent substrate 1. The phase shifters 3 are placed in every other light transmitting portion 4 between the adjacent light blocking patterns 2.

In the operation of this embodiment, when light 5 is incident upon the transparent substrate 1, the light blocking pattern 2 blocks a part of the incident light 5. Further, the incident light 5 is partly inverted in phase by the phase shifters 3 and passes through it as outgoing light 6.

Figure 2A:
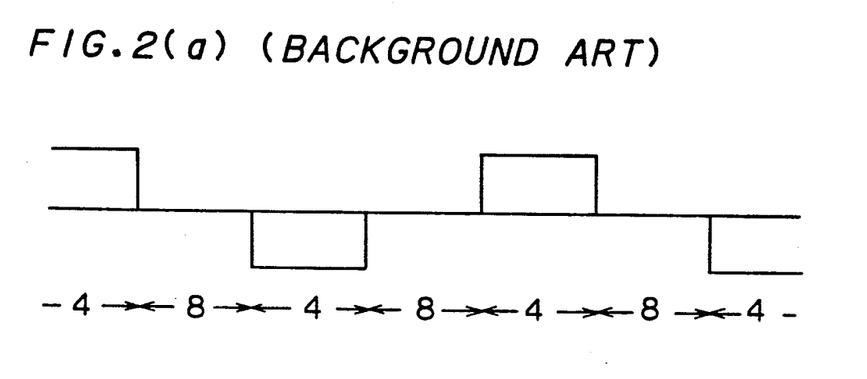
FIGS. 2a and 2b is a wave form chart showing an optical image obtained by the photomask in FIG. 1.
Figure 2B:
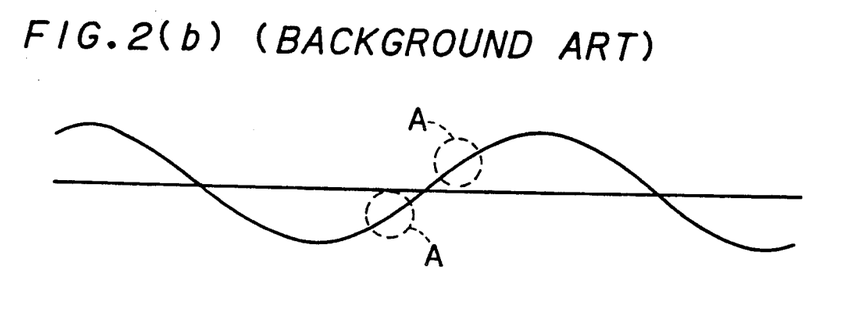

FIG. 2(a) shows an amplitude of an optical image of the outgoing light 6 just after outgoing from the transparent substrate 1 and the phase shifters 3. The outgoing light 6 is directed through an optical system 7 to a semiconductor wafer (not shown) which is coated with photoresist. Thus, the photoresist is exposed to light according to the pattern of the light blocking patterns 2. FIG. 2(b) shows an amplitude of an optical image of the outgoing light 6 after passing through the optical system 7. Lights refracted from the light transmitting portions 4 on opposite sides of a light blocking portion 8 to the light blocking portion 8 where light is blocked by the light blocking pattern 2 cancel each other, because they are opposite in phase. As a result, the resolution and the depth of focus are improved.

In the conventional photomask having a structure as stated above, a grouped pattern would be effective in improving the resolution and the depth of focus. However, there is the problem that an isolated pattern could not attain such an effect. As shown in an encircled part A in FIG. 2(b), since an edge of an optical image is not sufficiently steep, in other words, the full width at half maximum of the optical image is relatively large, there arises the problem that the boundary of photoresist photosensing/non-photosensing is easily varied, and the obtained resist pattern is insufficiently stable.

SUMMARY OF THE INVENTION

A photomask in accordance with the present invention comprises a light blocking portion substantially blocking light, and at least one of first and second light transmitting portions formed adjacently to the light blocking portion for transmitting the light, the first light transmitting portion including a relatively small first portion positioned on its end for transmitting the light in a first phase and a relatively large second portion adjacent to the first portion for transmitting the light in a second phase opposite to the first phase, the second light transmitting portion including a relatively small third portion positioned on its opposite end for transmitting the light in the second phase and a relatively large fourth portion adjacent to the third portion for transmitting the light in the first phase.

In a preferred embodiment, the light blocking portion may be formed of a repetitive pattern of a fifth portion for transmitting the light in the first phase and a sixth portion for transmitting the light in the second phase, and the repetitive pattern may have a cycle pitch under the resolution of an optical system to which the photomask is applied.

According to a photomask of the present invention, a light transmitted by a relatively large second portion in a first light transmitting portion and a light transmitted by a relatively large fourth portion in a second light transmitting portion are reversed to each other in phase, and hence the refracted lights to a light blocking portion cancel each other. Relatively small first and third portions on ends of the first and second light transmitting portions are reversed in phase to the relatively large second and fourth portions adjacent thereto, and hence the refracted lights from the second and fourth portions to the light blocking portion are cancelled by the transmitted lights from the first and third portions having the opposite phase. This causes an edge of an optical image of the photomask to be steep whether the photomask is structured with a grouped pattern or not. Consequently, in the case where an optical image is directed to photoresist, the boundary of the photoresist photosensing/non-photosensing is not easily varied, and a stable resist pattern can be obtained.

With the light blocking portion formed with a minute repetitive pattern of a fifth portion transmitting light in a first phase and a sixth portion transmitting light in a second phase, the light blocking portion can be simultaneously formed in the step of manufacturing the first and second light transmitting portions, and thus the manufacturing process can be considerably simplified.

Accordingly, it is an object of the present invention to provide a photomask capable of giving an optical image having a steep edge, or having a relatively small half band width, not only with a grouped pattern but with an isolated pattern.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 3:
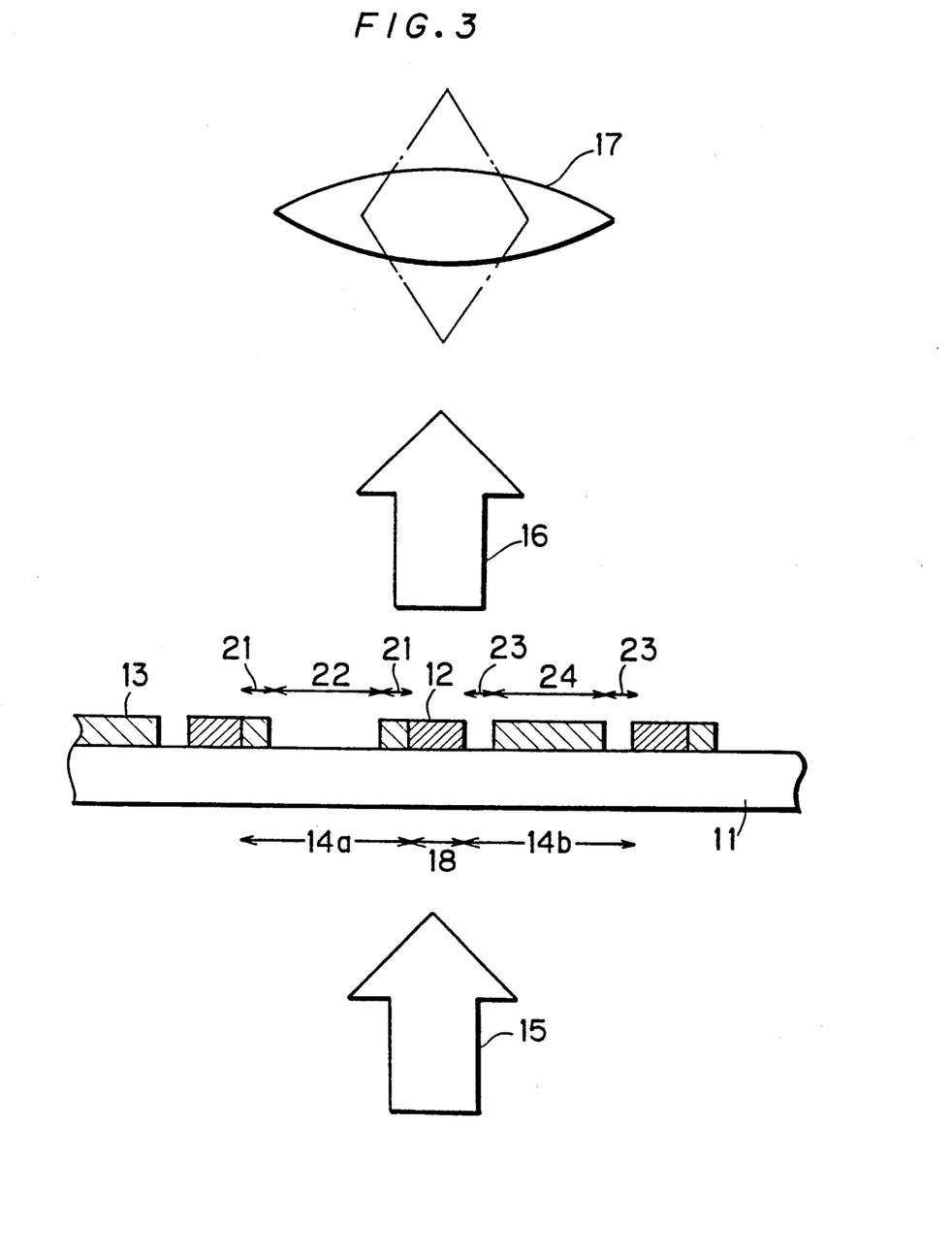
FIG. 3 is a sectional view showing an embodiment of a photomask according to the present invention.

FIG. 3 is a sectional view showing an embodiment of a photomask according to the present invention. In FIG. 3, reference numeral 11 denotes a transparent substrate like a quartz substrate. Light blocking patterns 12 like a chrome pattern defining, for example, a wire pattern and phase shifters 13 for shifting the phase of a transmitted light by ½ wavelength are formed on the transparent substrate 11. In a first light transmitting portion 14a on one side of the light blocking pattern 12, the phase shifters 13 are formed in relatively small first portions 21 on opposited ends of the first light transmitting portion 14a, but not formed in a relatively large second portion 22 between the first portions 21. On the other hand, in a second light transmitting portion 14b on the other side of the light blocking pattern 12, unlike the first light transmitting portion 14a, the phase shifter 13 is not formed in relatively small third portions 23 on the opposite ends of the second light transmitting portion 14b, but is formed in a relatively large fourth portion 24 between the third portions 23. Specifically, the first and second light transmitting portions 14a and 14b are reversed in the phases of lights transmitting therethrough, and the first and second light transmitting portions 14a and 14b have their respective opposite ends provided with minute phase-reversed portions (first and second portions 21 and 23).

In the operation, when light 15 is incident upon the transparent substrate 11, a part of the incident light 15 is blocked by the light blocking patterns 12. Further, the incident light 15 is partly inverted in phase by the phase shifters 13 and passes thorugh it as outgoing light 16. The outgoing light 16 from the transparent substrate 11 and the phase shifters 13 is directed through an optical system 17 to a semiconductor waver (not shown) coated, for example, with photoresist. Thus, the photoresist is exposed to light according to the pattern of the light blocking patterns 12.

FIG. 4(a) shows an amplitude of an optical image of the outgoing light 16 just after outgoing from the transparent substrate 11 and the phase shifters 13. FIGS. 4(b) and 4(c) show the optical image separated into an optical image of the outgoing light from the second and fourth portions 22 and 24 and an optical image of the outgoing light from the first and third portions 21 and 23, wherein FIG. 4(b) shows the optical image of the outgoing light just after outgoing from the second and fourth portions 22 and 24, while FIG. 4(c) shows the optical image of the outgoing light just after outgoing from the first and third portions 21 and 23. As shown in the figures, a light passing through the light transmitting portions (the first and fourth portions 21 and 24) with the phase shifters 13 gives a negative amplitude inverted in phase, while a light passing through the light transmitting portions (the second and third portions 22 and 23) without the phase shifters 13 gives a positive amplitude non-inverted in phase. In light blocking portions 18 provided with the light blocking patterns 12, light is blocked.

Figure 4:
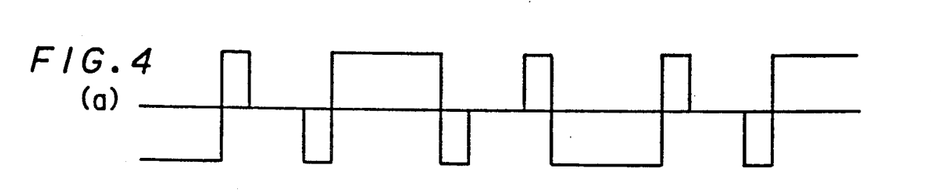
FIGS. 4a, 4b, 4c, 4d, 4e and 4f is a wave form chart showing an optical image obtained by the photomask in FIG. 3.

FIGS. 4(d) and 4(e) show optical images of outgoing lights after passing through the optical system 17, corresponding to FIGS. 4(b) and 4(c), respectively. FIG. 4(f) is a composite chart of FIGS. 4(d) and 4(e) and shows an optical image of an outgoing light after passing through the optical system 17 (i.e., all the outgoing light 16), corresponding to FIG. 4(a). As will be recognized through a comparison of FIG. 4 with FIG. 2, since the optical image in FIG. 4(b) of the outgoing light 16 just after outgoing is similar to the optical image in FIG. 2(a) obtained with a conventional photomask, the optical image in FIG. 4(d) just after passing through the optical system 17 is also similar to the optical image in FIG. 2(b) obtained with a conventional photomask. Specifically, similar to the conventional photomask in FIG. 1, lights refracted from the adjacent light transmitting portions 14a and 14b to the light blocking portion 18 therebetween are reversed in phase and cancel each other, and therefore the resolution and the depth of focus are improved.

In this embodiment, since an optical image in FIG. 4(e) which corresponds to the first and third portions 21 and 23 exists besides the optical image in FIG. 4(d), an edge of an optical image directed to the photoresist through the optical system 17 is steep as shown in an encircled part B in FIG. 4(f) compared with an edge obtained through the conventional photoresist in an encircled part A in FIG. 2(b). Specifically, the outgoing light from the first and third portions 21 and 23 and the outgoing light from the second and fourth portions 22 and 24 are reversed in phase, and hence the outgoing light from the second and fourth portions 22 and 24 which is refracted to the light blocking portion 18 is cancelled by the outgoing light from the first and third portions 21 and 23. Thus, as shown in FIG. 4(f), an optical image which is small in half band width can be obtained. With this optical image, since the boundary of photoresist photosensing/non-photosensing is not easily varied, an obtained resist pattern is stable. With not only a grouped pattern as shown in the figure but an isolated pattern, an optical image which is small in half band width can be obtained when portions having opposite phases, such as the first and third portions 21 and 23, are provided on opposite ends or one end of a light transmitting portion.

FIG. 5 is a sectional view showing an example of a method of manufacturing the photomask in FIG. 3. Hereinafter the manufacturing method will be described with reference to FIG. 5.

Figure 5A:
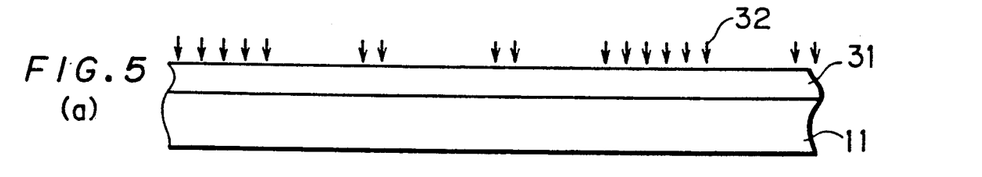
FIGS. 5a, 5b, 5c, 5d, 5e, 5f and 5g is a sectional view showing processes of manufactuirng the photomask in FIG. 3.
Figure 5B:
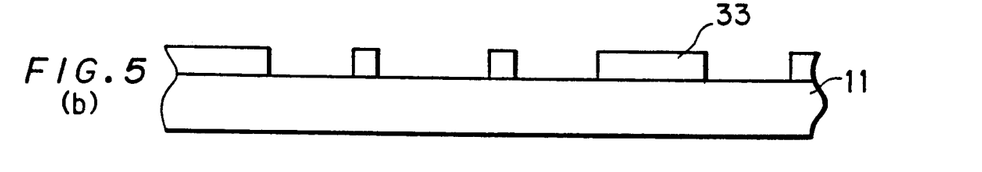

First, as shown in FIG. 5(a), after resist 31 for an electron ray is formed on the transparent substrate 11 such as a quartz substrate, an electron ray 32 is selectively directed. Developing removes an unexposed portion of the resist 31, and an exposed portion remains as a resist pattern 33, as shown in FIG. 5(b).

Figure 5C:
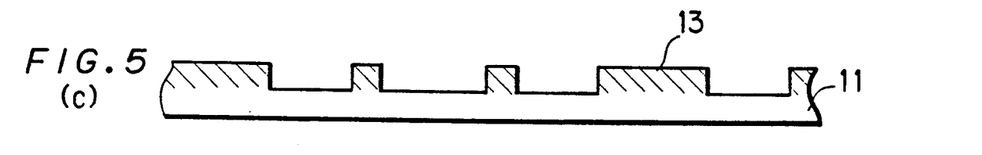

Then, the transparent substrate 11 is etched using the resist pattern 33 as a mask, and thereafter, the resist pattern 33 is removed. Thus, as shown in FIG. 5(c), the phase shifters 13 are formed on the transparent substrate 11. In this embodiment, unetched thick parts of the transparent substrate 11 are used as the phase shifters 13.

Figure 5D:
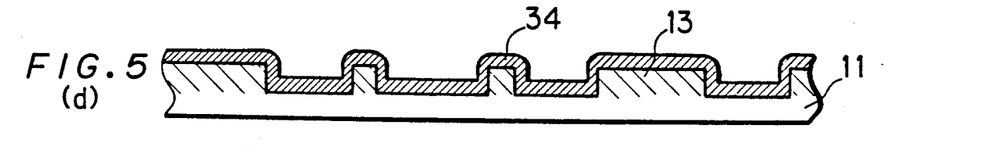
Figure 5E:
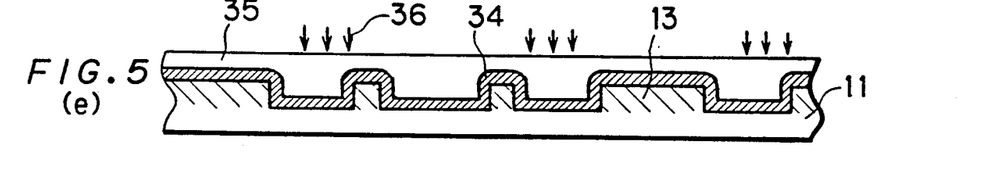
Figure 5F:
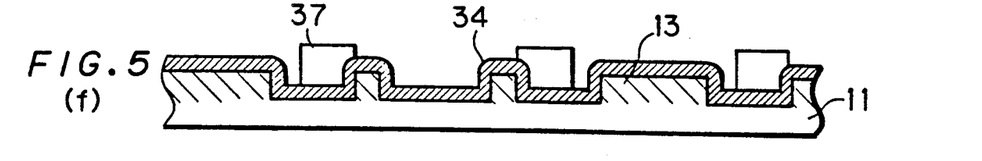

Then, as shown in FIG. 5(d), a chrome film 34 is deposited over the entire surface. Further, as shown in FIG. 5(e), after all the surface is coated with resist 35 for an electron ray, an electron ray 36 is selectively directed. Developing removes an unexposed part of the resist 35, and an exposed part remains as a resist pattern 37, as shown in FIG. 5(f).

Figure 5G:
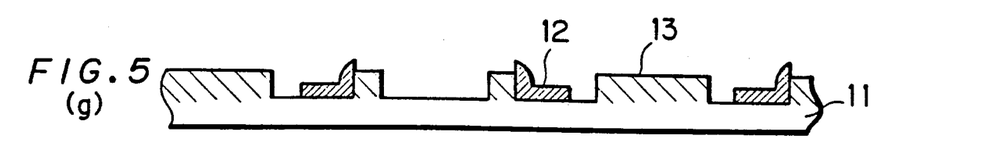

Last, the chrome film 34 is etched using the resist pattern 37 as a mask, and thereafter the resist pattern 37 is removed. Thus, as shown in FIG. 5(g), light blocking patterns 12 consisting of chrome patterns are formed. In this way, a photomask equivalent to that shown in FIG. 3 can be obtained.

Incidentally, although chrome is used as a material of the light blocking patterns 12, other materials such as MoSi may be used.

Figure 6:
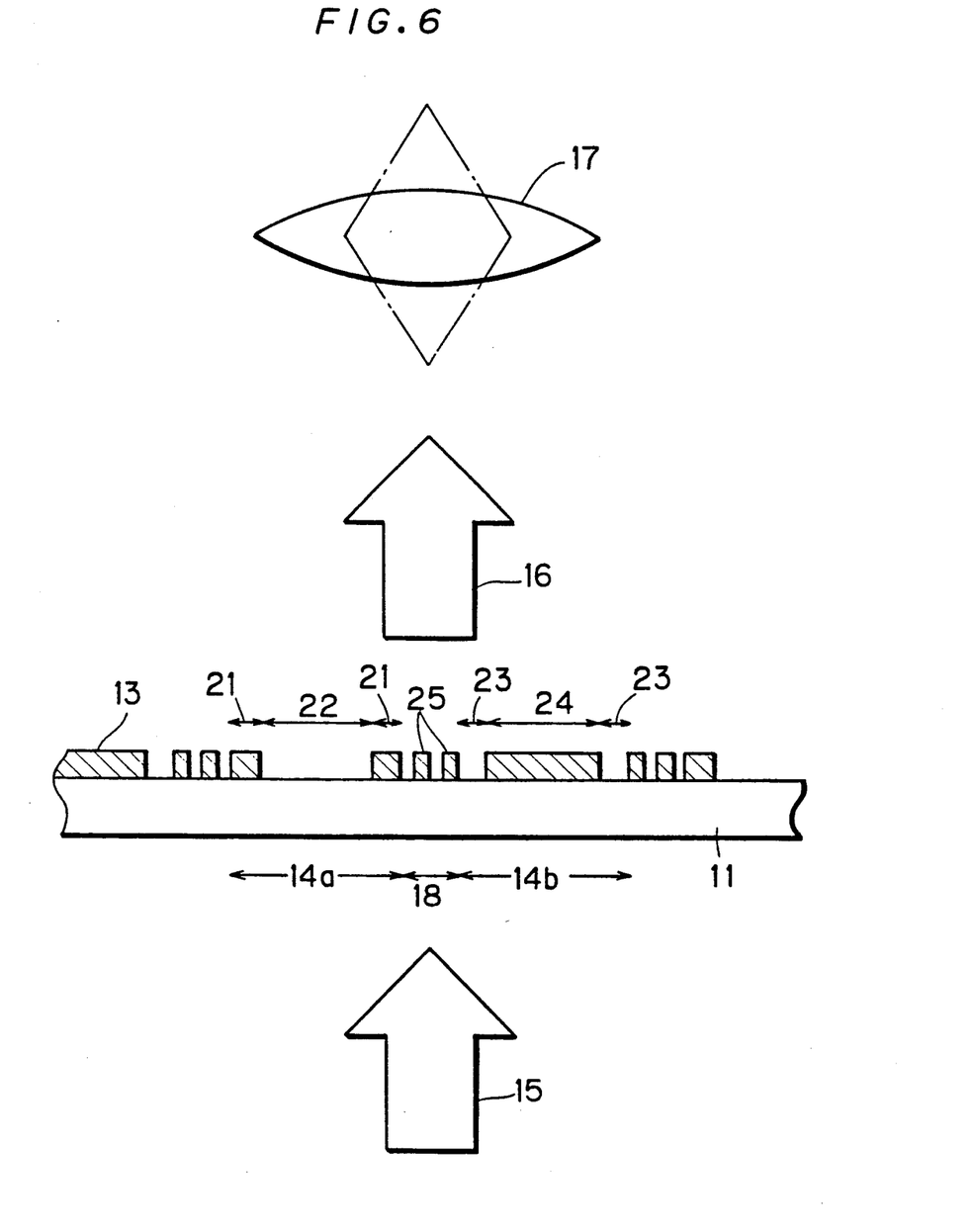
FIG. 6 is a sectional view showing another embodiment of the photomask according to the present invention.

FIG. 6 is a sectional view showing another embodiment of the photomask according to the present invention. In this embodiment, each light blocking pattern 18 is formed with an intermittently repetitive pattern of a minute phase shifter 25. The pitch of the repitition is selected to be under the resolution of the optical system 17. Other structures are the same as those of the photomask in FIG. 3.

Figure 7A:
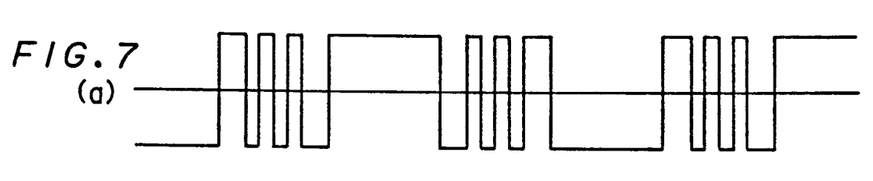
FIGS. 7a, 7b, 7c, 7d, 7e and 7f is a wave form chart showing an optical image of the photomask in FIG. 6.
Figure 7B:
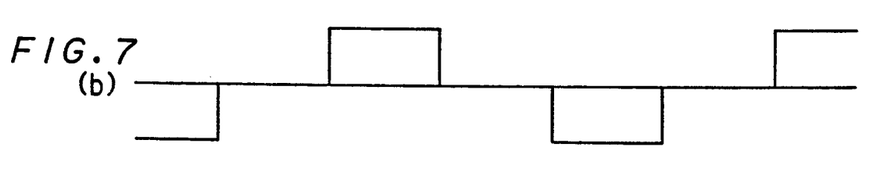
Figure 7C:
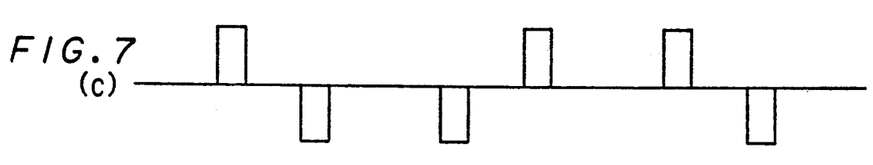
Figure 7D:
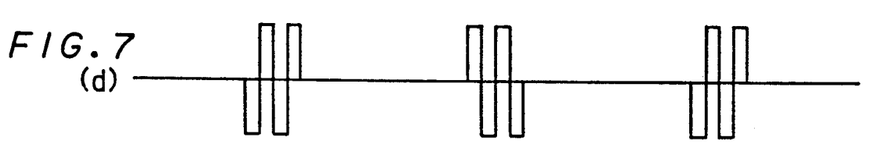
Figure 7E:
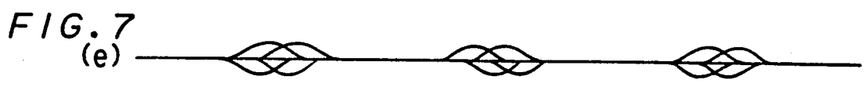
Figure 7F:
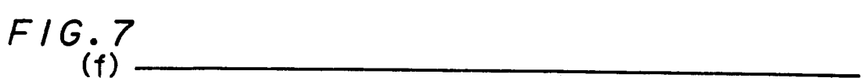

FIG. 7(a) shows an amplitude of the optical image of the outgoing light 16 just after outgoing from the photomask. The optical image can be separated into the optical images of the outgoing lights from the second and fourth portions 22 and 24, the first and third portions 21 and 23 and the light blocking portion 18, as shown in FIGS. 7(b), 7(c) and 7(d), respectively. FIGS. 7(b) and 7(c) are completely the same as FIGS. 4(b) and 4(c). The optical image in FIG. 7(d) has an amplitude repetitively turning positive and negative in a cycle pitch under the resolution of the optical system 17. This optical image completely loses the original form after passing through the optical system 17, as shown in FIG. 7(e), and the sum of the resultant optical image is approximately zero, as shown in FIG. 7(f). In other words, light is substantially blocked. Thus, in the photomask in FIG. 6, substantially the same operation as in the photomask in FIG. 3 can be performed. Namely, the optical images just the same as those in FIGS. 4(d), 4(e) and 4(f) are obtained with the photomask in FIG. 6.

With the photomask in FIG. 6, in addition to the advantages of the photomask in FIG. 3, the advantage that the photomask is manufactured in a simple way without separately forming the light blocking patterns 12. In the manufacturing process in FIG. 5, the steps of FIG. 5 (d) to FIG. 5(g) are unnecessary, and thus the manufacturing process is considerably simplified.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A photomask, comprising:
a light blocking portion substantially blocking light; and
at least one of first and second light transmitting portions formed adjacently to said light blocking portion for transmitting said light,
said first light transmitting portion including a first portion positioned on one of its ends for transmitting said light in a first phase, and a second portion which is larger than said first portion and is adjacent to said first portion, for transmitting said light in a second phase opposite to said first phase,
said second light transmitting portion including a relatively small third portion positioned on that one of its ends which is asymmetric with the first portion, relative to the light blocking portion, for transmitting said light in said second phase and a fourth portion which is larger than and adjacent to said third portion, for transmitting said light in said first phase.

2. A photomask in accordance with claim 1, wherein said light blocking portion is formed of a repetitive pattern of a fifth portion for transmitting said light in said first phase and a sixth portion for transmitting said light in said second phase; and
said repetitive pattern has a cycle pitch under a resolution of an optical system to which said photomask is applied.

3. A photomask according to claim 1, wherein the second and fourth portions of the first and second light transmitting portions, respectively, are further from the light blocking portion than the first and second portions, respectively.

4. A photomask, comprising:
a light blocking portion substantially blocking light; and
first and second light transmitting portions formed on opposite sides of said light blocking portion for transmitting said light;
said first light transmitting portion including first portions positioned on its opposite ends, for transmitting said light in a first phase, and a second portion which is larger than and positioned between said first portions, for transmitting said light in a second phase opposite to said first phase,
said second light transmitting portion including third portions positioned on its opposite ends for transmitting said light in said second phase and a fourth portion which is larger than and is positioned between said third portions for transmitting said light in said first phase.

5. A photomask in accordance with claim 4, wherein said light blocking portion is formed of a repetitive pattern of a fifth portion for transmitting said light in said first phase and a sixth portion for transmitting said light in said second phase; and
said repetitive pattern has a cycle pitch under the resolution of an optical system to which said photomask is applied.

6. A photomask in accordance with claim 4, wherein said light blocking portion includes a light blocking pattern formed on a transparent substrate,
said first and fourth portions include phase shifters formed on said transparent substrate for shifting a phase of said light by ½ wavelength, and
said second and third portions include portions of said transparent substrate provided thereon with nothing.

7. A photomask in accordance with claim 6, wherein said light blocking pattern includes a chrome pattern.

8. A photomask in accordance with claim 6, wherein said transparent substrate includes a quartz substrate.

9. A photomask in accordance with claim 6, wherein said phase shifters includes portions of said transparent substrate that are thicker than other portions of said transparent substrate.

10. A photomask, comprising a light blocking portion substantially blocking transmission of light therethrough; and
a means for modifying the phase of light transmitted through said photomask along first and second sides of said light blocking portion, comprising uncoated regions of said photomask which provide to the light transmitted therethrough a first phase and coated regions of said photomask which provide to light transmitted therethrough a second phase which is different from said first phase, wherein a first coated region and a first uncoated region are disposed on the first side of said light blocking portion and a second coated region and a second uncoated region are disposed along a second side of said light blocking portion, and
wherein said means for modifying the phase provides to light traversing said photomask at first and second positions which are on either side of said light blocking portion and which are equal distances from said light blocking portion, the first phase and the second phase, respectively.

11. A photomask according to claim 10, wherein: an intensity of light directly beneath the light blocking portion is decreased, and an intensity contrast in a region beneath connecting regions of the light blocking portion and the light transmiting portion is increased.

* * * * *